United States Patent [19]

Kano

[11] Patent Number: 5,380,679
[45] Date of Patent: Jan. 10, 1995

[54] PROCESS FOR FORMING A MULTILAYER WIRING CONDUCTOR STRUCTURE IN SEMICONDUCTOR DEVICE

[75] Inventor: Isao Kano, Tokyo, Japan

[73] Assignee: NEC Corporation, Tokyo, Japan

[21] Appl. No.: 130,854

[22] Filed: Oct. 4, 1993

[30] Foreign Application Priority Data

Oct. 2, 1992 [JP] Japan ................................. 4-264462

[51] Int. Cl.$^6$ .......................................... H01L 21/443
[52] U.S. Cl. ..................................... 437/192; 437/195; 437/230; 257/770; 257/763
[58] Field of Search ............... 437/192, 195, 230, 245; 257/763, 770

[56] References Cited

U.S. PATENT DOCUMENTS

| | | | |
|---|---|---|---|
| 5,173,449 | 12/1992 | Lorenzen et al. | 437/192 |
| 5,202,579 | 1/1993 | Fujii et al. | 257/751 |
| 5,225,372 | 7/1993 | Savkar et al. | 437/190 |
| 5,232,873 | 8/1993 | Geva et al. | 437/192 |
| 5,286,675 | 2/1994 | Chen et al. | 437/195 |

Primary Examiner—Olik Chaudhuri
Assistant Examiner—Richard A. Booth
Attorney, Agent, or Firm—Burns, Doane, Swecker & Mathis

[57] ABSTRACT

In a process for forming a multilayer wiring conductor structure, an interlayer insulator film is deposited on a surface including an upper surface of a lower layer wiring conductor, and the deposited interlayer insulator film is planarized so as to expose the upper surface of the lower layer wiring conductor. Then, a bonding metal film is deposited on a surface of the interlayer insulator film exposing the upper surface of the lower layer wiring conductor, and a photoresist film is coated on the bonding metal film and patterned. By using the patterned photoresist, a hole for formation of a connection pillar between the lower layer wiring conductor and a possible upper layer wiring conductor and a patterning of the bonding metal film are simultaneously formed. Accordingly, the bonding metal film can be formed and patterned on the upper surface of the lower layer wiring conductor without increasing the photolithography steps.

12 Claims, 8 Drawing Sheets

PROCESS FOR FORMING A MULTILAYER WIRING CONDUCTOR STRUCTURE IN SEMICONDUCTOR DEVICE

BACKGROUND OF THE INVENTION

1. Field of the Invention

The present invention relates to a method for manufacturing a semiconductor device, and more specifically to a process for forming a multilayer wiring conductor structure in the semiconductor device.

2. Description of Related Art

In general, aluminum has frequently been used as a wiring conductor for a semiconductor device, since the aluminum is excellent in processibility, in adhesive property to an insulator film, and in economy. However, with a multilayered and microminiaturized wiring conductor structure which has contributed to a recent increase of an integration density, various problems such as electromigration, stress-migration and corrosiveness trend to occur. As a countermeasure for these problems, attention has been paid to a multilayered wiring conductor structure of a noble metal formed by using a plating.

Referring to FIGS. 1A to 1H, there are shown sectional views illustrating one process known to the inventor for manufacturing a semiconductor device.

Figure 1A:
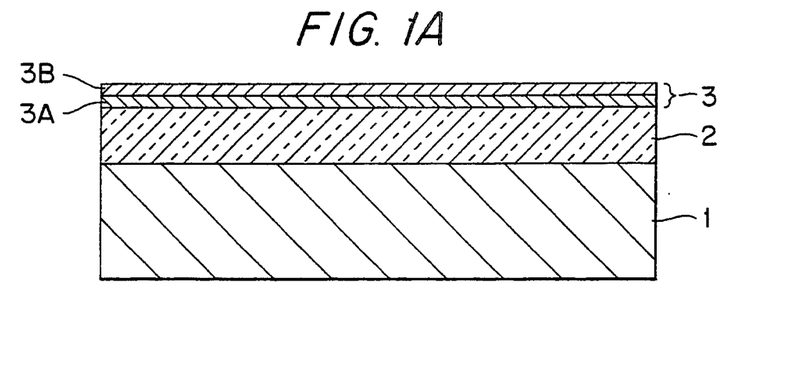
FIGS. 1A to 1H are sectional views illustrating one process known to the inventor for forming a multilayer wiring conductor structure.

As shown in FIG. 1A, a power supply film 3 is formed on an insulator film 2 formed on a silicon substrate 1 by depositing a titanium tungsten film 3A and a gold film 3B in the named order.

Figure 1B:
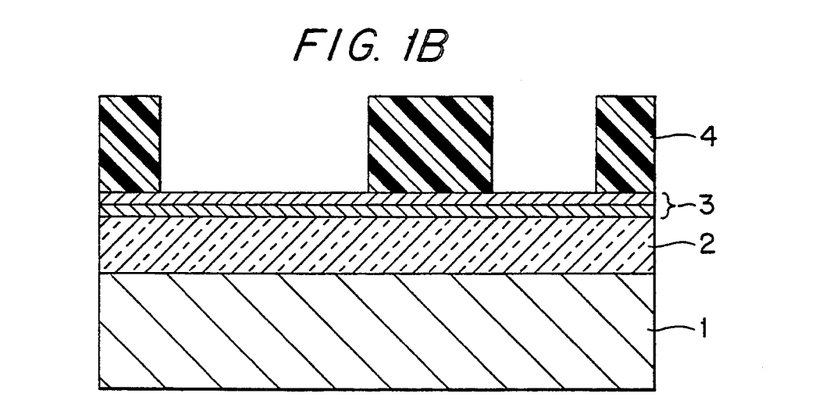

Then, as shown in FIG. 1B, a photoresist film 4 is coated on the power-supply film 3, and is patterned so as to form a first mask for a lower layer wiring conductor formation.

Figure 1C:
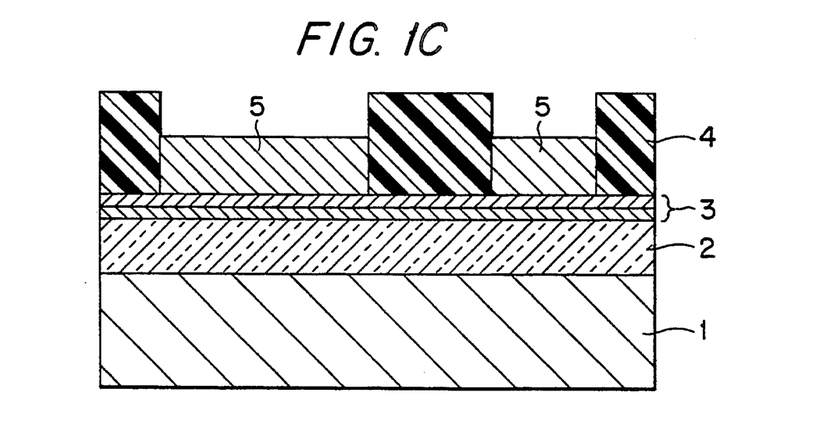

As shown in FIG. 1C, an electroplating is performed using the photoresist film 4 as a mask, so that a gold film is deposited on the exposed power supply film 3 so as to form a lower layer wiring conductor 5.

Figure 1D:
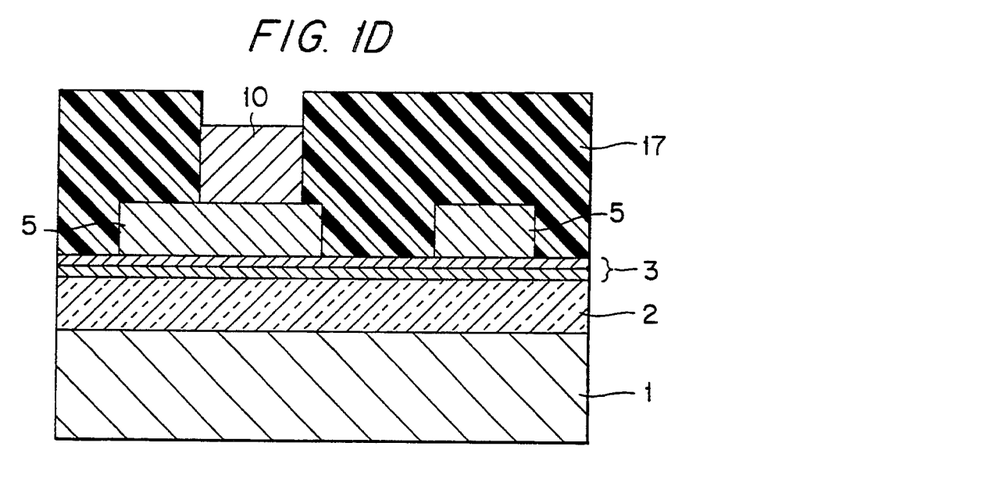

Thereafter, the photoresist film 4 is removed, and then, as shown in FIG. 1D, a photoresist film 17 is coated and patterned to form a through hole for formation of a connection pillar between the lower layer wiring conductor 5 and a possible upper layer wiring conductor. Then, an electroplating is performed so as to deposit a gold film on the lower layer wiring conductor 5 within the through hole, so that a connection pillar 10 is formed.

Figure 1E:
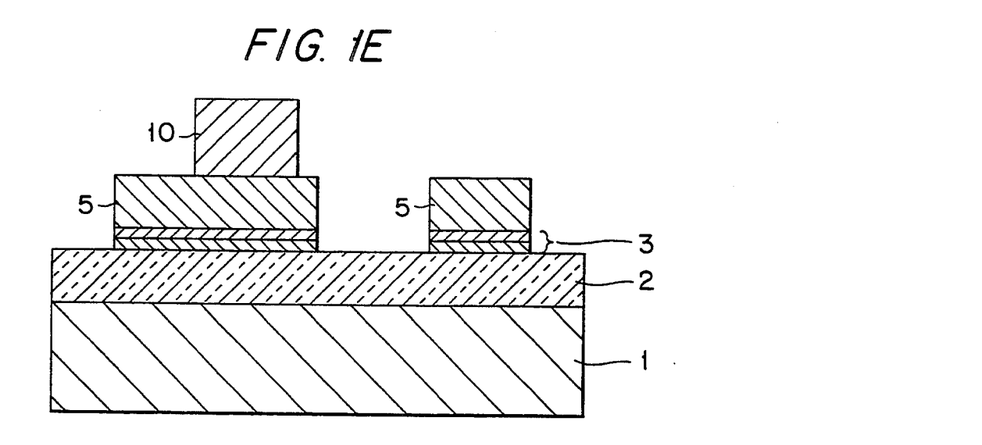

As shown in FIG. 1E, the photoresist film 17 is removed, and the power supply film 3 is selectively removed by an etching using the lower layer wiring conductor 5 as a mask.

Figure 1F:
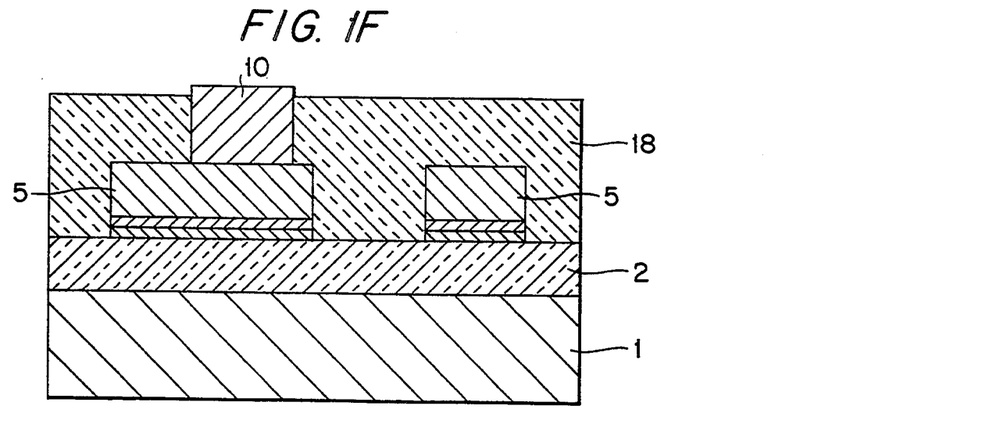

As shown in FIG. 1F, an interlayer insulator film 18 is deposited on the surface including the lower layer wiring conductor 5 and the connection pillar 10, and the deposited interlayer insulator film 18 is etched back so as to planarize the upper surface and to expose an upper end surface of the connection pillar 10.

Figure 1G:
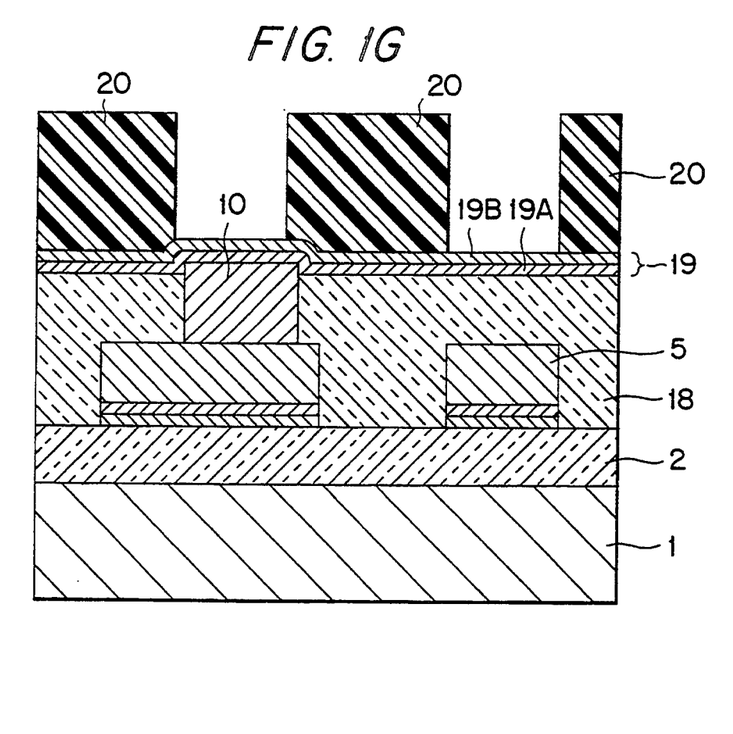

In a process similar to that for forming the lower layer wiring conductor 5, as shown in FIG. 1G, a power supply film 19 is formed by depositing a titanium tungsten film 19A and a gold film 19B on the interlayer insulator film 18 and the exposed connection pillar 10, and, a photoresist film 20 is coated on the power supply film 19 and then patterned to form a mask for the possible upper layer wiring conductor.

Figure 1H:
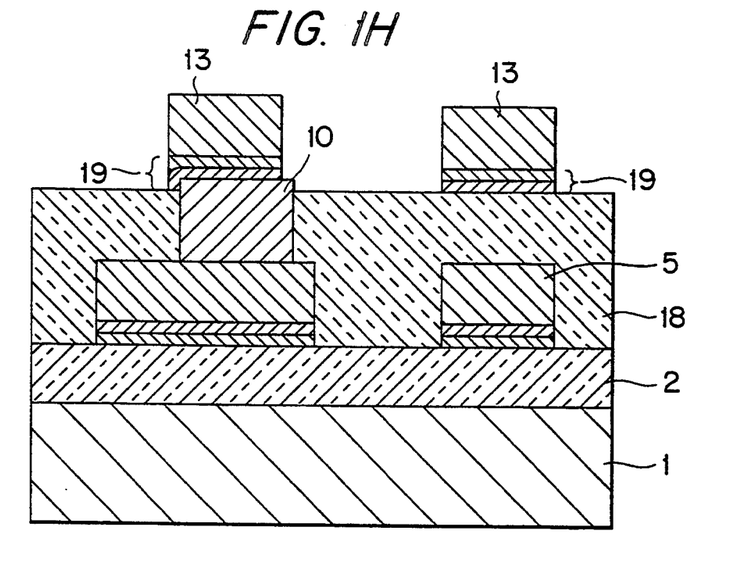

As shown in FIG. 1H, an electroplating is performed using the photoresist film 20 as a mask, to deposit a gold film on the power supply film 19 so as to form an upper layer wiring conductor 13, and thereafter, the photoresist film 20 is removed.

In the above mentioned process for manufacturing the semiconductor device, since the noble metal wiring conductors are formed by using the plating technique, it is possible to elevate an electromigration resistance and a stress-migration resistance. However, adhesive property between an upper surface of the noble metal wiring conductors and the interlayer insulator film is poor, and therefore, reliability is inevitably low.

SUMMARY OF THE INVENTION

As one means for improving the adhesive property between an upper surface of the noble metal wiring conductors and the interlayer insulator film, it could be considered to form a bonding film of titanium or titanium ahoy between the upper surface of the wiring conductors and the interlayer insulator film. However, for each of the respective layers of the wiring conductors, there is required a photolithography step for patterning the bonding film formed on the upper surface of the wiring conductor. Therefore, the number of steps for forming the multilayer wiring conductor structure is increased.

Accordingly, it is an object of the present invention to provide a process for forming a multilayer wiring conductor structure in the semiconductor device, which has overcome the defect mentioned above.

Another object of the present invention is to provide a process for forming a multilayer wiring conductor structure in the semiconductor device, capable of forming a bonding film on the upper surface of the wiring conductor without increasing the number of steps required for forming the multilayer wiring conductor structure.

The above and other objects of the present invention are achieved in accordance with the present invention by a process for forming a multilayer wiring conductor structure in a semiconductor device, comprising the steps of forming a power supply film for plating on an insulator film formed on a semiconductor substrate; coating a first photoresist film on the power supply film and patterning the first photoresist film to form a first mask having a pattern for a lower layer wiring conductor formation; depositing a metal film on the power supply film by a plating process using the first mask as a mask so as to form a lower layer wiring conductor; removing the first mask; selectively removing the power supply film by using the lower layer wiring conductor as a mask; depositing a first interlayer insulator film on a surface including the lower layer wiring conductor; etching back the deposited first interlayer insulator film so as to planarize the first interlayer insulator film and to expose an upper surface of the lower layer wiring conductor; depositing a bonding metal layer on a surface including the upper surface of the lower layer wiring conductor; coating a second photoresist film on the bonding metal layer and patterning the second photoresist film to form a second mask having a hole for formation of a connection pillar between the lower layer wiring conductor and a possible upper layer wiring conductor and a pattern for separation of the bonding metal film; selectively etching the bonding metal film by using the second mask as a mask so as to remove the bonding metal film within the hole for formation of a connection pillar and to remove the bonding metal film from a region other than a region above the lower layer wiring conductor; depositing a metal layer on the lower layer wiring conductor film within the hole for formation of a connection pillar by a plating process using the second mask as a mask, so as to form a connection pillar between the lower layer wiring conductor and a possible upper layer wiring conductor; removing the second mask: depositing a second interlayer insulator film on a surface including the connection pillar; etching back the second interlayer insulator film so as to planarize the second interlayer insulator film and to expose an upper surface of the connection pillar; and selectively forming on the second interlayer insulator film an upper layer wiring conductor in contact with the upper surface of the connection pillar.

According to another aspect of the present invention, there is provided a process for forming a multilayer wiring conductor structure in a semiconductor device, comprising the steps of forming a power supply film for plating on an insulator film formed on a semiconductor substrate; coating a first photoresist film on the power supply film and patterning the first photoresist film to form a first mask having a pattern for a lower layer wiring conductor formation; removing the power supply film by an etching using the first mask as a mask so as to selectively expose the insulator film, selectively depositing a first interlayer insulator film on an exposed surface of the insulator film by using the first mask as a mask; removing the first mask; depositing a metal film on the power supply film by a plating using the first interlayer insulator film as a mask so as to form a lower layer wiring conductor having a height near to an upper surface of the first interlayer insulator film; depositing a bonding metal layer on a surface including the an upper surface of the lower layer wiring conductor; coating a second photoresist film on the bonding metal layer and patterning the second photoresist film to form a second mask having a hole for formation of a connection pillar between the lower layer wiring conductor and a possible upper layer wiring conductor and a pattern for separation of the bonding metal film; selectively etching the bonding metal film by using the second mask as a mask so as to remove the bonding metal film within the hole for formation of a connection pillar and to remove the bonding metal film from a region other than a region above the lower layer wiring conductor; depositing a metal layer on the lower layer wiring conductor film within the hole for formation of a connection pillar by a plating process using the second mask as a mask, so as to form a connection pillar between the lower layer wiring conductor and a possible upper layer wiring conductor; removing the second mask; depositing a second interlayer insulator film on a surface including the connection pillar; etching back the second interlayer insulator film so as to planarize the second interlayer insulator film and to expose an upper surface of the connection pillar; and selectively forming on the second interlayer insulator film an upper layer wiring conductor in contact with the upper surface of the connection pillar.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 2A to 2G, there is shown a first embodiment of the process in accordance with the present invention for forming a multilayer wiring conductor structure. In FIGS. 2A to 2G, elements similar to those shown in FIGS. 1A to 1H are given the same Reference Numerals.

Figure 2A:
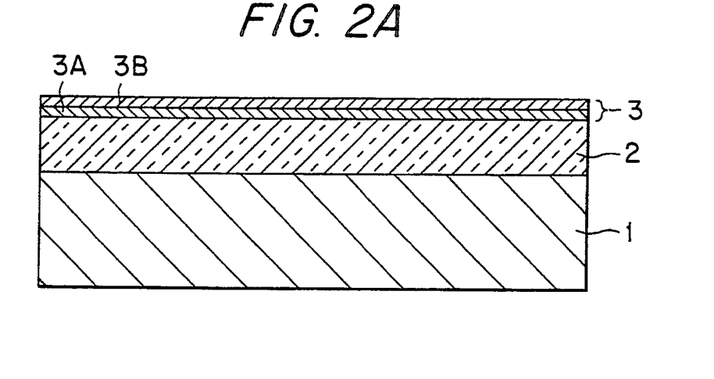
FIGS. 2A to 2G are sectional views illustrating a first embodiment of the process in accordance with the present invention for forming a multilayer wiring conductor structure.

As shown in FIG. 2A, on an insulator film 2 of a silicon oxide formed on an upper surface of a silicon substrate 1, a power supply film 3 is formed by sequentially depositing a titanium tungsten film 3A of 50 nm to 200 nm in thickness and a gold (or platinum) film 3B of 30 nm to 100 nm in thickness by a sputtering in the named order. This power supply layer 3 has a first function of ensuring the adhesive property to an underlying layer, a second function of a current path for an electroplating, and a third function of a barrier layer for ensuring a heat resistance. The power supply layer 3 can be formed of a stacked layer of a platinum or palladium film deposited on a titanium or titanium nitride film.

Figure 2B:
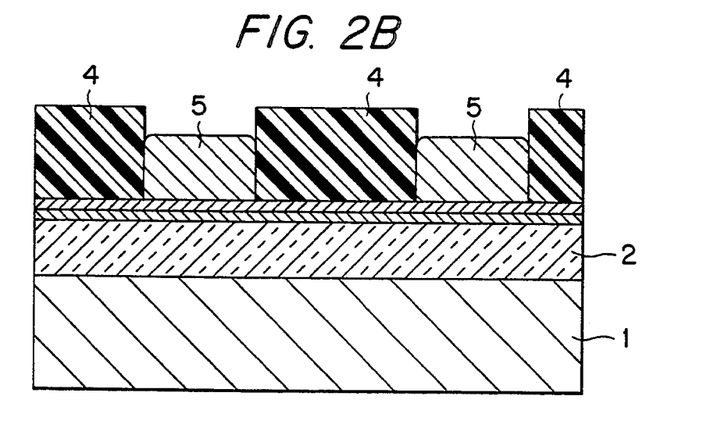

Then, as shown in FIG. 2B, a photoresist film 4 is coated on the power supply film 3, and is patterned so as to form a first mask having a pattern or groove for a lower layer wiring conductor formation, and an electroplating is performed using the photoresist film 4 as a mask, so as to deposit on the exposed power supply film 3 a metal film of gold, silver, copper or the like which has a low electric resistance and which is easy to plate. Thus, a lower layer wiring conductor 5 is formed.

Thereafter, the photoresist film 4 is removed, and then, the power supply film 3 is removed by an etching using the lower layer wiring conductor 5 as a mask. Then, as shown in FIG. 2C, an interlayer insulator film 6 is coated on the surface including the lower layer wiring conductor 5, and the deposited interlayer insulator film 6 is etched back so as to planarize the upper surface and to expose an upper end surface of the lower layer wiring conductor 5.

Figure 2C:
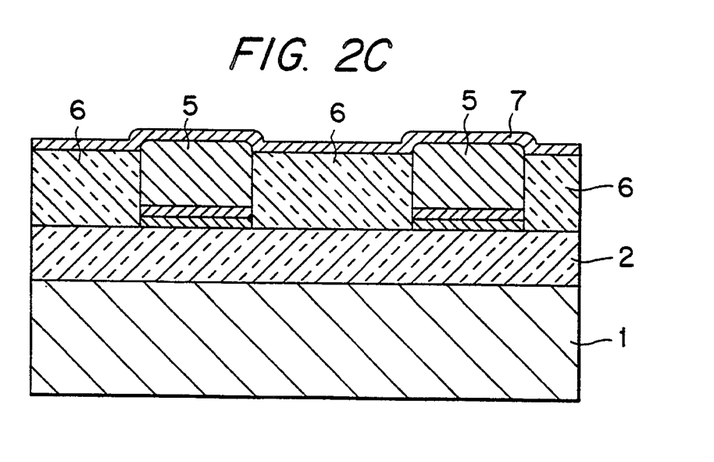

On a surface of the deposited interlayer insulator film 6 having the upper end surface of the lower layer wiring conductor 5, a bonding metal film 7 of a titanium film or a titanium-tungsten film having a thickness of 10 nm to 100 nm is deposited as shown in FIG. 2C. The bonding metal film 7 is required to have (1) an excellent property of adhesion to the lower layer wiring conductor 5, (2) an excellent property of adhesion to an overlying insulating film such as a silicon nitride film, a silicon oxide film or a silicon nitride oxide film, which are formed for example by a plasma CVD process, (3) a good thermal stability of the bonding metal film itself, (4) a good processibility of the bonding metal film itself, and (5) a property that does not greatly vary the resistance of the lower layer wiring conductor 5 by a heat treatment.

Therefore, the bonding metal film 7 is preferably formed of a titanium film or a titanium-tungsten film as mentioned above.

Figure 2D:
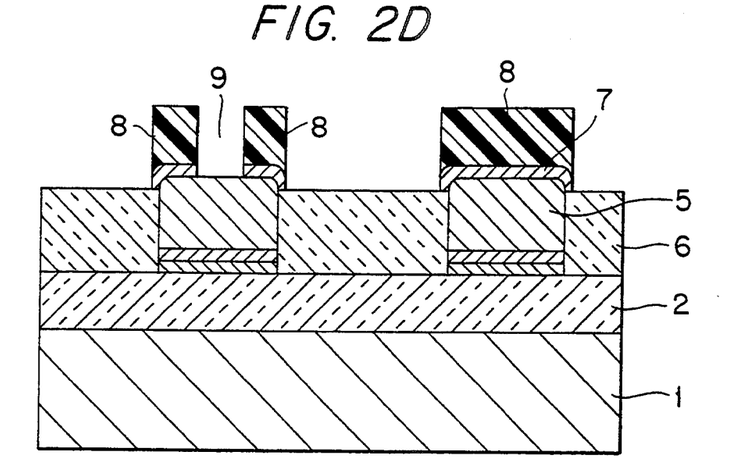

Thereafter, a photoresist film 8 is coated on the bonding metal film 7, and then, patterned so as to form a second mask having a pattern for formation of a connection pillar between the lower layer wiring conductor 5 and a possible upper layer wiring conductor and a pattern for separation of the bonding metal film 7, as shown in FIG. 2D. The bonding metal film 7 is selectively removed by an etching using the patterned photoresist film 8 as a mask, so that a hole 9 for the connection pillar is formed in the bonding metal film 7 just above a selected portion of the lower layer wiring conductor 5, and the bonding metal film 7 is removed from a region excluding a region just above the other lower layer wiring conductor 5.

Figure 2E:
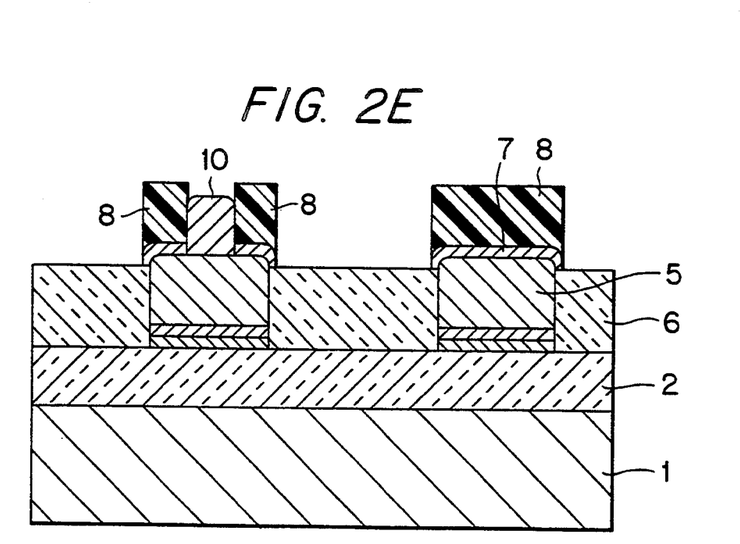

As shown in FIG. 2E, a gold film is deposited on an upper surface of the lower layer wiring conductor 5 exposed within the hole 9 by an electroless plating using the patterned photoresist film 8 as a mask, so that a connection pillar 10 is formed. Here, in some cases, gold film may be deposited on side surfaces of the bonding metal film 7 and a portion of the surface of the interlayer insulating film 6. In this case, the surface of the interlayer insulating film 6 is cleaned or etched by using the photoresist film 8 as a mask, so that the deposited gold film is removed from the surface of the interlayer insulating film 6. With this cleaning, a short-circuiting between the lower layer wiring conductors 5 can be prevented.

Figure 2F:
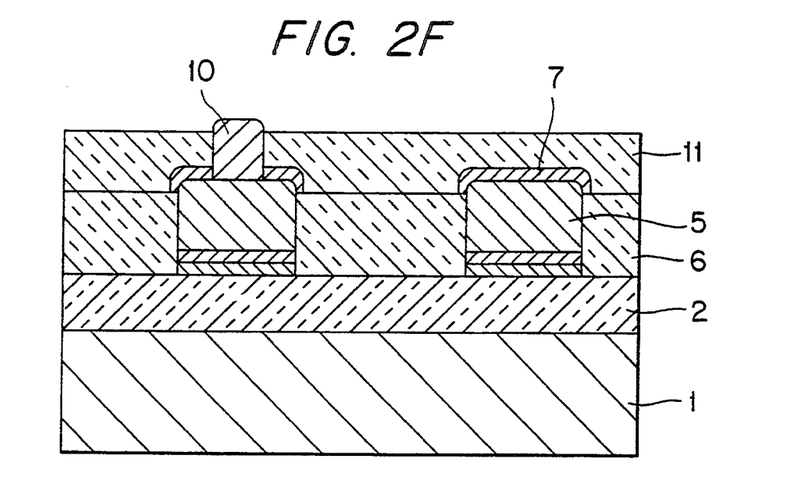

Thereafter, as shown in FIG. 2F, the photoresist film 8 is removed, and then, a second interlayer insulator film 11 is coated on the surface including the connection pillar 10, and etched back so as to planarize the surface and to expose an upper end surface of the connection pillar 10. Here, each of the first interlayer insulator film 6 and the second interlayer insulator film 11 can be formed of any one of a silicon nitride film, a silicon oxide film and a silicon nitride oxide film, which are deposited by a plasma CVD process, or a stacked layer composed of any one of the silicon nitride film, the silicon oxide film and silicon nitride oxide film as mentioned above and a SOG (spin on glass) film, or a polyimide resin film.

Figure 2G:
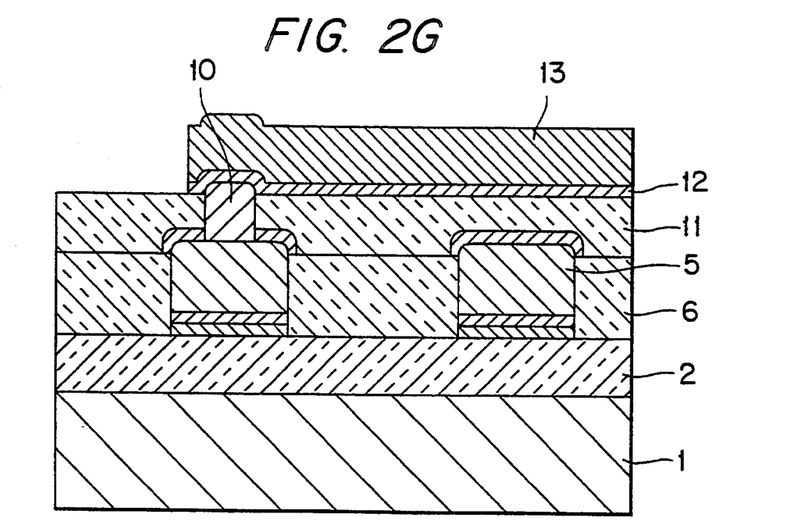

As shown in FIG. 2G, in a process similar to that for forming the lower metal wiring film, a power supply film 12 is formed on the interlayer insulator film 11 and the exposed connection pillar 10, and a gold film is selectively deposited on the power supply film 12 by an electroplating so as to form an upper layer wiring conductor 13. Thereafter, the power supply film 12 is removed by an etching using the upper layer wiring conductor 13 as a mask. Thus, there is obtained the upper layer wiring conductor 13 which is electrically connected to the lower layer wiring conductor 5 through the connection pillar 10.

Referring to FIGS. 3A to 3E, there is shown a second embodiment of the process in accordance with the present invention for forming a multilayer wiring conductor structure. In FIGS. 3A to 3E, elements similar to those shown in FIGS. 2A to 2H are given the same Reference Numerals.

Figure 3A:
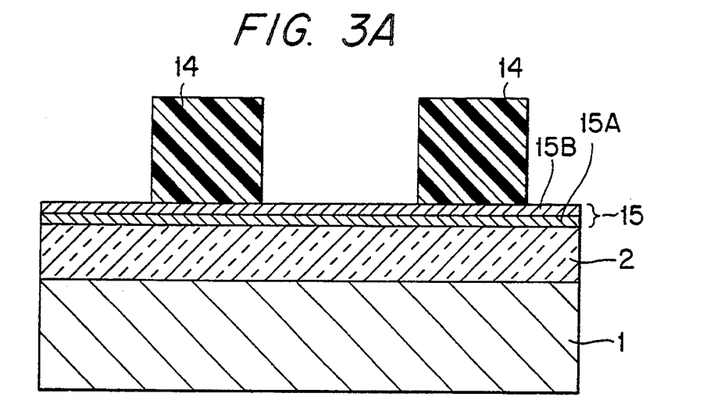
FIGS. 3A to 3E are sectional views illustrating a second embodiment of the process in accordance with the present invention for forming a multilayer wiring conductor structure.

As shown in FIG. 3A, and similarly to the first embodiment, on an insulator film 2 on a silicon substrate 1, a metal film 15 for plating is formed by sequentially depositing a titanium tungsten film 15A of 50 nm to 200 nm in thickness and a gold (or platinum) film 15B of 30 nm to 100 nm in thickness in the named order. Then, a photoresist film 14 is coated on the metal film 15, and is patterned so as to form a first mask having a pattern for a lower layer wiring conductor formation.

Figure 3B:
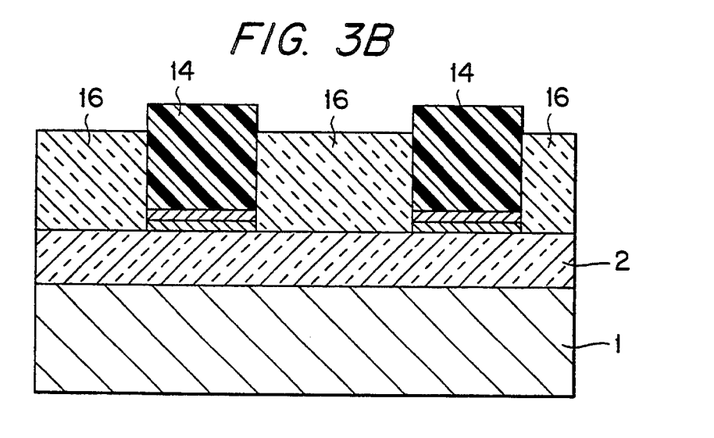

As shown in FIG. 3B, the metal film 15 etched by using the photoresist film 14 as a mask, so as to form a patterned metal film 15 for a lower layer wiring conductor formation. Then, a silicon oxide film is deposited by a selective liquid phase deposition process using the photoresist film 14 as a mask, so that an interlayer insulator film 16 is formed. Here, the thickness of the interlayer insulator film 16 is made larger than that of a possible lower layer wiring conductor.

Figure 3C:
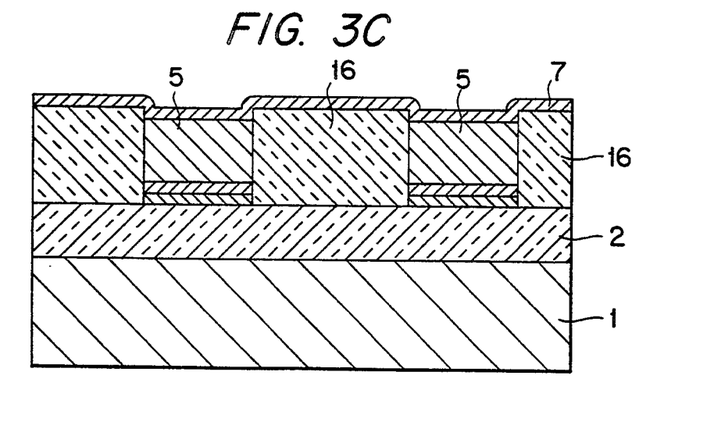

As shown in FIG. 3C, the photoresist film 14 is removed, and then, a gold film is deposited on the patterned metal film 15 by an electroless plating using the interlayer insulator film 16 as a mask, so that a lower layer wiring conductor 5 is formed. The surface including an upper end surface of the lower layer wiring conductor 5 is planarized to an extent that the upper end surface of the lower layer wiring conductor 5 does not reach a level of the upper surface of the interlayer insulator film 16. Next, a bonding metal film 7 is deposited on the surface including the upper end surface of the lower layer wiring conductor 5.

Figure 3D:
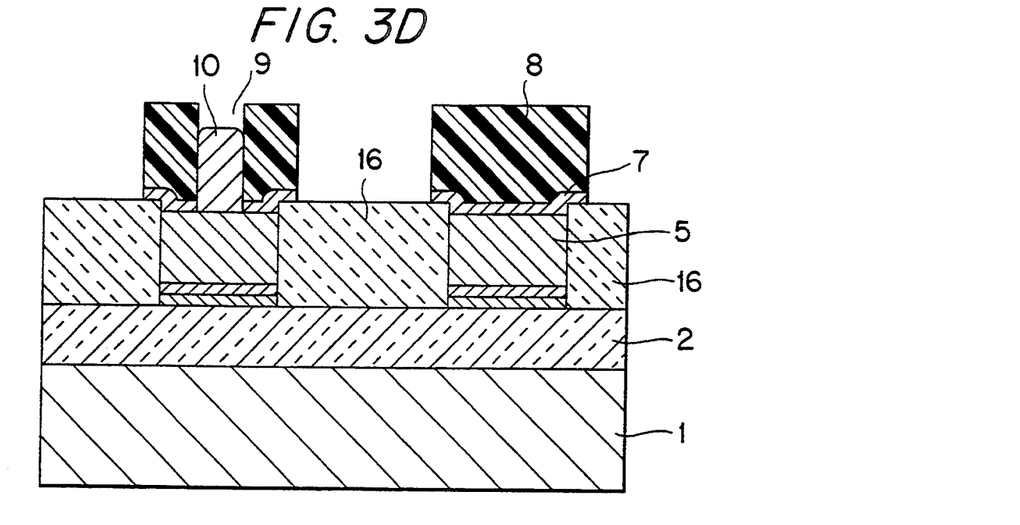

Thereafter, as shown in FIG. 3D, and similarly to the first embodiment, a photoresist film 8 is coated on the bonding metal film 7, and then, patterned so as to form a second mask having a pattern for formation of a connection pillar between the lower layer wiring conductor 5 and a possible upper layer wiring conductor and a pattern for separating the bonding metal film 7. The bonding metal film 7 is selectively etched using the patterned photoresist film 8 as a mask, so that a hole 9 for the possible connection pillar is formed in a selected portion of the lower layer wiring conductor 5, and the bonding metal film 7 is removed from a region excluding a region just above the other lower layer wiring conductor 5. Then, a gold film is deposited on an upper surface of the lower layer wiring conductor 5 exposed within the hole 9 by an electroless plating using the patterned photoresist film 8 as a mask, so that a connection pillar 10 is formed.

Figure 3E:
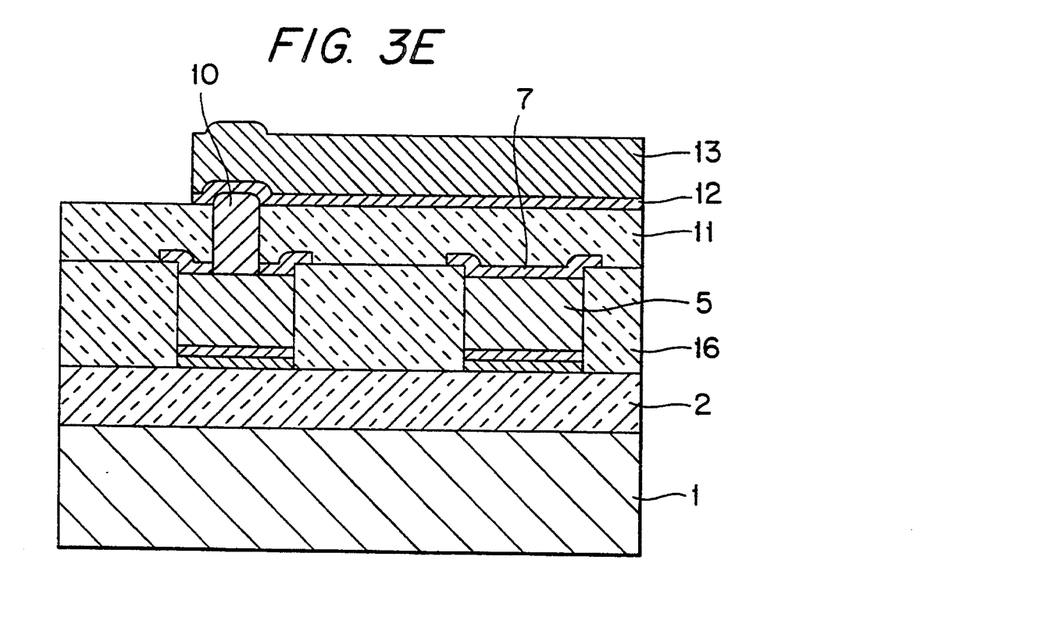

Thereafter, as shown in FIG. 3E, a power supply film 12 and an upper layer wiring conductor 13 are formed on the second interlayer insulator film 11 and in contact with the upper end surface of the connection pillar 10, in steps similar to corresponding ones of the first embodiment.

As will be apparent from the above, the process in accordance with the present invention for forming a multilayer wiring conductor structure, is characterized in that a bonding metal film is formed on a first interlayer insulator film including an upper end surface of the lower layer wiring conductor, and a hole for formation of a connection pillar between the lower layer wiring conductor and a possible upper layer wiring conductor and a pattern for separation of the bonding metal film are simultaneously formed in the bonding metal film by only one photolithography step using a mask formed on the bonding metal. Accordingly, the bonding metal film can be formed on the upper surface of the lower layer wiring conductor without increasing the photolithography steps, so that the adhesive property between the wiring conductor and the interlayer insulator film can be increased, and therefore, reliability can be elevated.

The invention has thus been shown and described with reference to the specific embodiments. However, it should be noted that the present invention is in no way limited to the details of the illustrated structures but changes and modifications may be made within the scope of the appended claims.

I claim:

1. A process for forming a multilayer wiring conductor structure in a semiconductor device, comprising the steps of:

forming a power supply film for plating on an insulator film formed on a semiconductor substrate;

coating a first photoresist film on said power supply film and patterning said first photoresist film to form a first mask having a pattern for a lower layer wiring conductor formation;

depositing a metal film on said power supply film by a plating process using said first mask so as to form a lower layer wiring conductor;

removing said first mask;

selectively removing said power supply film by using said lower layer wiring conductor as a mask;

depositing a first interlayer insulator film on a surface including said lower layer wiring conductor;

etching back said deposited first interlayer insulator film so as to planarize said first interlayer insulator film and to expose an upper surface of said lower layer wiring conductor;

depositing a bonding metal film on a surface including said upper surface of said lower layer wiring conductor;

coating a second photoresist film on said bonding metal layer and patterning said second photoresist film to form a second mask having a hole for formation of a connection pillar between said lower layer wiring conductor and a possible upper layer wiring conductor and a pattern for separation of said bonding metal film;

selectively etching said bonding metal film by using said second mask so as to remove said bonding metal film within said hole for formation of a connection pillar and to remove said bonding metal film from a region other than a region above said lower layer wiring conductor;

depositing a metal layer on said lower layer wiring conductor film within said hole for formation of a connection pillar by a plating process using said second mask so as to form a connection pillar between said lower layer wiring conductor and a possible upper layer wiring conductor;

removing said second mask;

depositing a second interlayer insulator film on a surface including said connection pillar; etching back said second interlayer insulator film so as to planarize said second interlayer insulator film and to expose an upper surface of said connection pillar; and selectively forming on said second interlayer insulator film a metal film so as to form an upper layer wiring conductor in contact with said upper surface of said connection pillar.

2. A process as claimed in claim 1 wherein said metal film of said lower layer wiring conductor is formed of a metal selected from the group consisting of gold, silver, and copper, and said metal film of said upper layer wiring conductor is formed of gold.

3. A process as claimed in claim 2 wherein said bonding metal film is formed of a metal having properties of adhesion to said lower layer wiring conductor, adhesion to said interlayer insulator layer, thermal stability, and processibility substantially similar to a titanium film, and said metal does not substantially vary the resistance of said lower layer wiring conductor by a heat treatment.

4. A process as claimed in claim 3 wherein said bonding metal film is formed of a film selected from the group consisting of a titanium film and a titanium-tungsten film.

5. A process as claimed in claim 3 wherein each of said first and second interlayer insulator films is formed of a film selected from the group consisting of a silicon nitride film, a silicon oxide film and a silicon oxynitride film.

6. A process as claimed in claim 3 wherein said connection pillar is formed by depositing a gold film by an electroless plating.

7. A process for forming a multilayer wiring conductor structure in a semiconductor device, comprising the steps of;

forming a power supply film for plating on an insulator film formed on a semiconductor substrate;

coating a first photoresist film on said power supply film and patterning said first photoresist film and to form a first mask having a pattern for a lower layer wiring conductor formation;

removing said power supply film by an etching using said first mask so as to selectively expose said insulator film, selectively depositing a first interlayer insulator film on an exposed surface of said insulator film by using said first mask;

removing said first mask;

depositing a metal film on said power supply film by a plating using said first interlayer insulator film as a mask so as to form a lower layer wiring conductor having an upper surface adjacent to an upper surface of said first interlayer insulator film;

depositing a bonding metal film on a surface including said upper surface of said lower layer wiring conductor;

coating a second photoresist film on said bonding metal layer and patterning said second photoresist film to form a second mask having a hole for formation of a connection pillar between said lower layer wiring conductor and a possible upper layer wiring conductor and a pattern for separation of said bonding metal film;

selectively etching said bonding metal film by using said second mask so as to remove said bonding metal film within said hole for formation of a connection pillar and to remove said bonding metal film from a region other than a region above said lower layer wiring conductor;

depositing a metal layer on said lower layer wiring conductor film within said hole for formation of a connection pillar by a plating process using said second mask so as to form a connection pillar between said lower layer wiring conductor and a possible upper layer wiring conductor;

removing said second mask;

depositing a second interlayer insulator film on a surface including said connection pillar;

etching back said second interlayer insulator film so as to planarize said second interlayer insulator film and to expose an upper surface of said connection pillar; and selectively forming on said second interlayer insulator film a metal film so as to form an upper layer wiring conductor in contact with said upper surface of said connection pillar.

8. A process as claimed in claim 7 wherein said metal film of said lower layer wiring conductor is formed of a metal selected from the group consisting of gold, silver, and copper, and said metal film of said upper layer wiring conductor is formed of gold.

9. A process as claimed in claim 8 wherein said bonding metal film is formed of a metal having properties of adhesion to said lower layer wiring conductor, adhesion to said interlayer insulator layer, thermal stability, and processibility substantially similar to a titanium film, and said metal does not substantially vary the resistance of said lower layer wiring conductor by a heat treatment.

10. A process as claimed in claim 9 wherein said bonding metal film is formed of a film selected from the group consisting of a titanium film and a titanium-tungsten film.

11. A process as claimed in claim 9 wherein each of said first and second interlayer insulator films is formed of a film selected from the group consisting of a silicon nitride film, a silicon oxide film and a silicon oxynitride film.

12. A process as claimed in claim 9 wherein said connection pillar is formed by depositing a gold film by an electroless plating.

* * * * *